(12) United States Patent
Brueck et al.

(10) Patent No.: US 12,092,959 B1
(45) Date of Patent: Sep. 17, 2024

(54) INTERFEROMETRIC LITHOGRAPHY GRATING-MASK-BASED WAFER-SCALE LARGE-AREA NANOPATTERNING

(71) Applicant: UNM RAINFOREST INNOVATIONS, Albuquerque, NM (US)

(72) Inventors: Steven R. J. Brueck, Albuquerque, NM (US); Alexander Neumann, Albuquerque, NM (US); Vineeth Sasidharan, Albuquerque, NM (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 24 days.

(21) Appl. No.: 17/592,659

(22) Filed: Feb. 4, 2022

Related U.S. Application Data

(60) Provisional application No. 63/146,067, filed on Feb. 5, 2021.

(51) Int. Cl.
  *G03F 7/00* (2006.01)
  *G02B 27/10* (2006.01)
  *G02B 27/14* (2006.01)

(52) U.S. Cl.
  CPC ..... *G03F 7/70408* (2013.01); *G02B 27/1086* (2013.01); *G02B 27/144* (2013.01); *G03F 7/7055* (2013.01)

(58) Field of Classification Search
  CPC ............... G03F 7/70408; G03F 7/7055; G02B 27/1086; G02B 27/144
  See application file for complete search history.

(56) References Cited

U.S. PATENT DOCUMENTS

| | | | |
|---|---|---|---|
| 11,644,665 B2 | 5/2023 | Frauenglass | |
| 2002/0122614 A1* | 9/2002 | Zhou | H04J 14/0208 385/24 |
| 2002/0196550 A1* | 12/2002 | Gerhard | G03F 7/70941 359/619 |
| 2006/0001855 A1* | 1/2006 | Lof | G03F 7/70275 355/53 |
| 2007/0139634 A1* | 6/2007 | Mulder | G03F 7/70141 355/53 |
| 2008/0129973 A1* | 6/2008 | McCafferty | G03F 7/70408 355/67 |
| 2017/0090289 A1* | 3/2017 | Yajima | G03F 7/2006 |

FOREIGN PATENT DOCUMENTS

CN  107290939 A * 10/2017 ............... G03F 7/20

* cited by examiner

*Primary Examiner* — Peter B Kim
(74) *Attorney, Agent, or Firm* — MH2 TECHNOLOGY LAW GROUP LLP

(57) ABSTRACT

According to examples of the present disclosure, a method for large-area, full-wafer nanopatterning is disclosed. The method includes providing a laser light source; providing beam conditioning and translation optics to expand the beam to illuminate a full wafer area; providing a grating beamsplitter; providing recombination optics to direct at least two beams from the grating beam splitter to a full wafer photoresist-coated target; and exposing the full wafer photoresist-coated target.

18 Claims, 12 Drawing Sheets

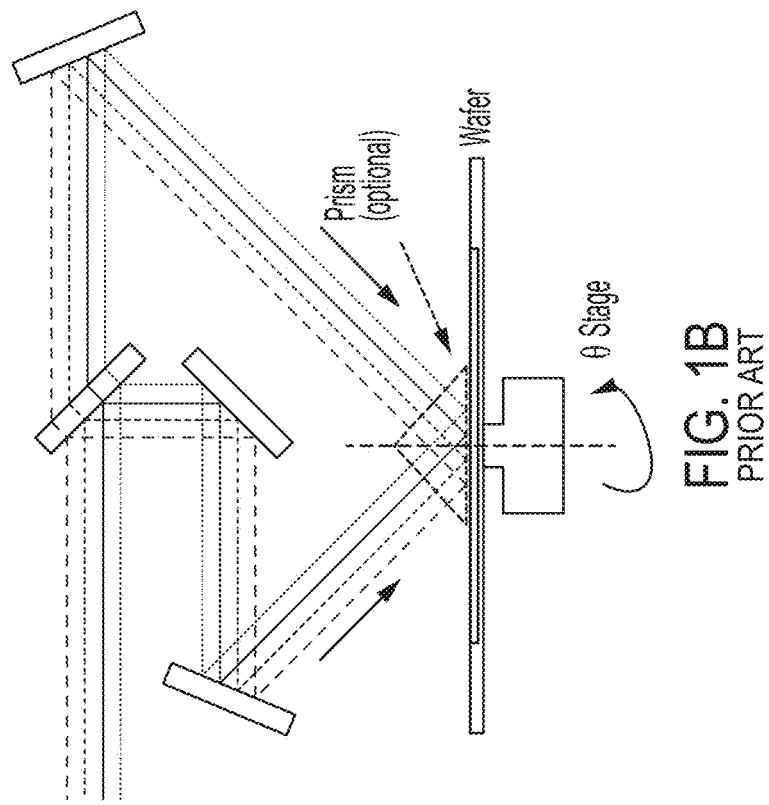
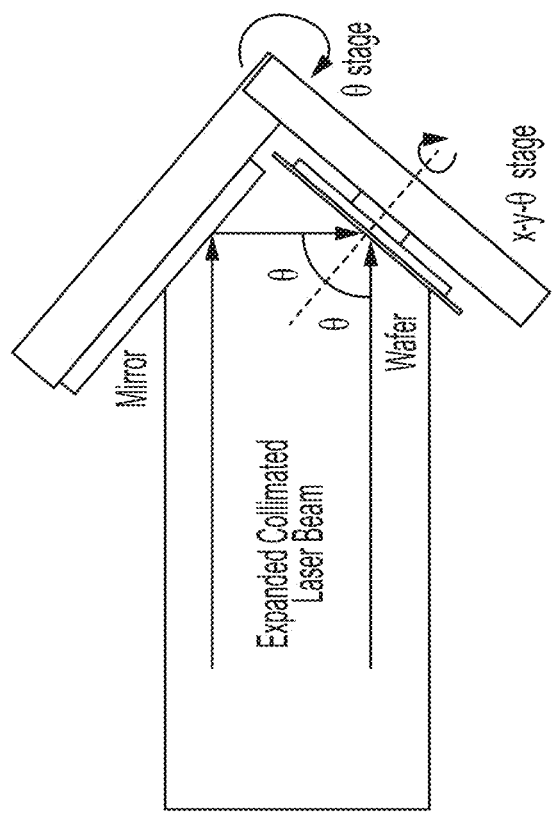
FIG. 1B PRIOR ART
FIG. 1A PRIOR ART

Cross-sectional view of the grating optical mount.

Photograph of patterned 4 inch wafer

INTERFEROMETRIC LITHOGRAPHY GRATING-MASK-BASED WAFER-SCALE LARGE-AREA NANOPATTERNING

CROSS-REFERENCE TO RELATED APPLICATIONS

This application claims priority to U.S. Provisional Application No. 63/146,067 filed on Feb. 5, 2021, the disclosure of which are incorporated by reference in its entirety.

GOVERNMENT SUPPORT

This invention was made with U.S. Government support under Grants No. 1635334 and EEC-1160494 awarded by the National Science Foundation. The U. S. Government has certain rights in the invention.

FIELD

This invention relates generally to methods and systems for interferometric lithography grating-mask-based wafer-scale large-area nanopatterning.

BACKGROUND

Nano patterning of periodic structures has a wide variety of application areas including nanofluidics, nanomagnetics, biophotonics, metamaterial fabrication, displays, solar photovoltaics among others. High volume, industrial applications require efficient large-area patterning. The solar cell industry, for example, needs techniques with capability of high-throughput, wafer-scale patterning. Conventional lithography, nano-imprint lithography (NIL) and interferometric lithography (IL) are potential candidates.

Conventional lithography using semiconductor industry tools certainly have the required resolution, however they are typically designed to produce relatively small 22×33 mm$^2$ fields with narrow kerfs that cannot be stitched together. Additionally, integrated circuit industry tools are quite expensive, as of 2020~$50M-$100M, which demands a very high volume manufacturing opportunity for amortization of the tool cost. Nanoimprint lithography requires expensive master masks and has difficulties at full wafer-scale. NIL tools designed for the IC industry produce the same small fields as the optical lithography tool.

Interferometric lithography (IL) is often described as a large area patterning technique, but most reports have been at several cm$^2$ level or smaller and there have been relatively few demonstrations at a full wafer-scale. Conventional IL (FIG. 1, prior art) with a partially-reflective beam splitter is limited in area by the longitudinal coherence length of the laser source since the two arms of the interferometer are matched in length at the center of the pattern but vary as the print area is increased in the dimension perpendicular to the grating lines. Single longitudinal mode single transverse mode (TEM$_{00}$) continuous wave lasers with additional optics such as intracavity etalons, for example Ar-ion lasers, allow sufficient coherence for large areas, but are limited in power density and require long exposure times and active stabilization to compensate for atmospheric fluctuations during the exposure. Fiber optical systems have been used for these cw lasers and offer some advantages, but are limited to low intensities and long path lengths for large areas, requiring long exposures and active stabilization. Step and repeat approaches where a small active field is illuminated and the wafer is moved under the beams require precision motion at scales of a small fraction of the period, necessitating systems for precise stage motion that are incompatible with high-speed manufacturing. Three-dimensional patterns have also been demonstrated, but not yet at a full wafer scale.

Two issues that have to be addressed in large area applications are: 1) maintaining a uniform exposure density across the full area of the grating, including the wafer edges; and 2) maintaining spatial coherence across the full exposure area.

Both CW and pulsed lasers have been used. Most CW lasers can be operated in single transverse modes, usually the TEM$_{00}$ mode which has a Gaussian intensity profile varying as $$I(r) = \frac{P_0}{\pi \sigma^2} e^{-2r^2/\sigma^2}$$

where I(r) is the intensity at a radius r from the beam center, P$_0$ is the total power in the beam and σ is the beam waist parameter. FIG. 2 shows the power within a disk of radius r/σ and the corresponding uniformity. If a uniformity of 95% is required, typical for photoresist applications, only 5% of the laser power is available.

For many manufacturing applications, pulsed lasers such as Nd:YAG (along with nonlinear processes to access the ultraviolet portion of the spectrum) and excimer lasers are often preferred, but suffer from comparatively poor longitudinal coherence. Excimer lasers have poor transverse coherence requiring careful beam profile matching. However, the advantage is that large powers and hence short exposure times are available, eliminating the need for active stabilization and allowing high throughputs. The beam intensity often has nonuniformities associated with multiple reflections and inhomogeneities in the beam profile resulting from damaged regions of the optical elements of the laser, nonlinear conversion crystals or optical train, as well as a complex modal pattern.

The intensity uniformity can be improved by averaging over regions of high and low intensity by moving the beam to different positions during the exposure. It is essential that this motion be imposed on the beam before the beam splitter so that it is common mode and the fringes are stationary at the wafer.

The longitudinal and transverse coherence issues both are eased by the use of grating beam-splitters in the place of the Lloyd's mirror or partially reflecting beam-splitters used in many of the applications discussed above and illustrated in FIG. 1A and FIG. 1B.

Conceptually, the simplest approach is to use a phase grating which produces only ±1$^{rst}$ order diffraction with a negligible amount of 0-order diffraction (transmission), and to place the sample in the optical path immediately after the grating.[i] Unfortunately, because IL is a coherent process, even a small amount (<~ 1%) of 0-order diffraction is enough to introduce a significant amount of pattern distortion, and manufacturing and maintenance of the required grating is difficult. Additionally, there is difficulty in managing the various reflected beams from the sample that return to the grating and are in turn reflected back onto the sample with uncontrolled phases relative to the initial pattern resulting in Moiré fringes. A commercial exposure tool (Seuss MJB-6 with an incoherent lamp source) has been adapted with the use of a phase mask and detailed control of the illumination angular spectrum.

Another alternative is to use the Talbot effect, the intensity pattern that repeats the grating period (self-images) at a distance of $(2d^2/\lambda \sim 1$ μm where $d \sim \lambda \sim 500$ nm) from the grating surface where d is the grating period and $\lambda$ the wavelength, and even with smaller periods at fractions of this distance. This requires very precise control of the distance and tilt between the grating and the sample, concomitant flatness of both the grating and the sample and also suffers from the multiple reflection issues described above.

Direct laser-material interactions have also been demonstrated eliminating the photoresist processing. Many of the same difficulties arise in extending to full wafer scale; in particular these processes are all significantly more energy intensive that exposing photoresist.

Thus, there remains a need for a robust approach to full wafer scale nanopatterning that can be both high speed and low cost, compatible with high volume manufacturing.

FIG. 1A and FIG. 1B show arrangements for conventional interferometric lithography, where FIG. 1A shows a single beam arrangement suitable for high transverse coherence and FIG. 1B shows a Michaelson interferometer arrangement for low transverse coherence. The right side beam is transmitted by the beam-splitter (BS) and reflected (image reversed) at the mirror; the left side beam is reflected three times (BS and two mirrors) so the two sides both have the same image reversal. The path lengths are adjusted so that the distance from the BS to the wafer is matched at the center of the wafer. In both cases, the size of the exposure field is limited by the longitudinal coherence of the laser source.

SUMMARY

According to examples of the present disclosure, a method for large-area, full-wafer nanopatterning is disclosed. The method for large-area, full-wafer nanopatterning comprises providing a laser light source; providing beam conditioning and translation optics to expand the beam to illuminate a full wafer area; providing a grating beam splitter; providing recombination optics to direct at least two beams from the grating beam splitter to a full wafer photoresist-coated target; and exposing the full wafer photoresist-coated target.

Various additional features can be included in the method for large-area, full-wafer nanopatterning including one or more of the following features. The beam conditioning optics includes an optical system to expand the beam such that a full wafer photoresist-coated target can be exposed. The beam conditioning optics includes one or more optical components and one or more actuator components that displace or shift the position of the exposing beams on the photoresist-coated target without moving the standing wave intensity pattern during the exposure to improve the uniformity of the exposure. A first surface of the grating beam-splitter is anti-reflection coated at the laser wavelength and a phase/amplitude grating is provided on the second surface. Alternatively, the first surface of the grating beam-splitter is uncoated and the grating beam-splitter is assembled in optical contact with a plane window with a single anti-reflection coated surface opposite to the grating. The recombination optics is configured to position at least two beams from the grating beam splitter onto the photoresist-coated target in a retro-reflector configuration wherein the photoresist-coated target is located adjacent to the grating beam-splitter. The beam conditioning optics can comprise one or more optical components and one or more actuator components that displace or shift the position of the exposing beams on the photoresist-coated target without moving the standing wave intensity pattern during the exposure to improve the uniformity of the exposure.

According to examples of the present disclosure, an apparatus for large-area, full-wafer nanopatterning is disclosed. The apparatus comprises a laser light source; beam conditioning and translation optics to expand the beam and illuminate a full wafer area; a grating beam splitter; recombination optics to direct at least two beams from the grating beam splitter to a full wafer photoresist-coated target; and a controller for controlling the exposure dose and uniformity at the photoresist-coated target.

Various additional features can be included in the method for large-area, full-wafer nanopatterning including one or more of the following features. The beam conditioning and translation optics includes an optical system to expand the beam such that a full wafer photoresist-coated target can be exposed. The beam conditioning and translation optics includes shift the position of the exposing beams on the photoresist-coated target without moving the standing wave intensity pattern during the exposure to improve the uniformity of the exposure. One surface of the grating beam splitter is anti-reflection coated at the laser wavelength and an optically thin phase/amplitude grating is provided on the opposite surface thereof. The first surface of the grating beam-splitter is uncoated and the grating beam-splitter is assembled in optical contact with a plane window with a single anti-reflection coated surface. The recombination optics is configured to position at least two beams from the grating beam splitter onto the photoresist-coated target in a retro-reflector configuration wherein the photoresist-coated target is located adjacent to the grating beam-splitter. The beam conditioning and translation optics can comprise one or more optical components and one or more actuator components that displace or shift the position of the exposing beams on the photoresist-coated target without moving the standing wave intensity pattern during the exposure to improve the uniformity of the exposure.

According to examples of the present disclosure, a method for large-area interferometric lithography is disclosed. The method for large-area interferometric lithography comprises providing a laser source; providing an apparatus for shifting the position of the laser beam during the exposure; providing beam conditioning optics for adjusting the size of the beam at a wafer to be exposed; providing a beam-splitter for dividing the laser power into at least two sub-beams; directing at least two of the sub-beams to form an interference pattern at the surface of the wafer to be exposed: providing a wafer coated with a photosensitive stack including at least a photoresist layer; adjusting the total exposure of the photoresist; exposing the wafer to record the interference pattern at the surface of the wafer; and developing at least the photoresist layer.

Various additional features can be included in the method for large-area, full-wafer nanopatterning including one or more of the following features. The apparatus for shifting the position of the laser beam comprises two transparent windows that are tilted in orthogonal directions on a time scale shorter than the exposure duration. The beam-splitter comprises a grating to generate diffracted orders from the laser beam source. The beam-splitter is a partial reflector. The beam-splitter is a Lloyd's mirror optic that folds part of the laser beam onto itself.

According to examples of the present disclosure, an apparatus for large area interferometric lithography is disclosed. The apparatus comprises a laser source; an optical shifter for shifting the position of the beams during the exposure; a beam conditioner for adjusting the size of the beam at a wafer to be exposed; a beam-splitter for dividing the laser power into at least two sub-beams; an optical director for directing two or more of the sub-beams onto the wafer to be exposed; a wafer coated with a photosensitive stack including at least a photoresist layer; an exposure controller to adjust the total exposure of the photoresist; and a developer to convert the exposure to a physical relief structure in the photoresist layer on the surface of the wafer.

Various additional features can be included in the apparatus for large area interferometric lithography including one or more of the following features. The optical shifter shifts the position of the laser beam consists of two transparent windows that are tilted in orthogonal directions on a time scale shorter than the exposure duration. The beamsplitter consists of a grating to generate diffracted orders from the laser beam source. The beamsplitter is a partial reflector. The beamsplitter is a Fresnel optic that folds part of the laser beam onto itself.

Advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE FIGURES

FIG. 1A and FIG. 1B show arrangements for conventional interferometric lithography where FIG. 1A shows a single beam arrangement suitable for high transverse coherence and FIG. 1B shows a Michaelson interferometer arrangement for low transverse coherence.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Figure 2:
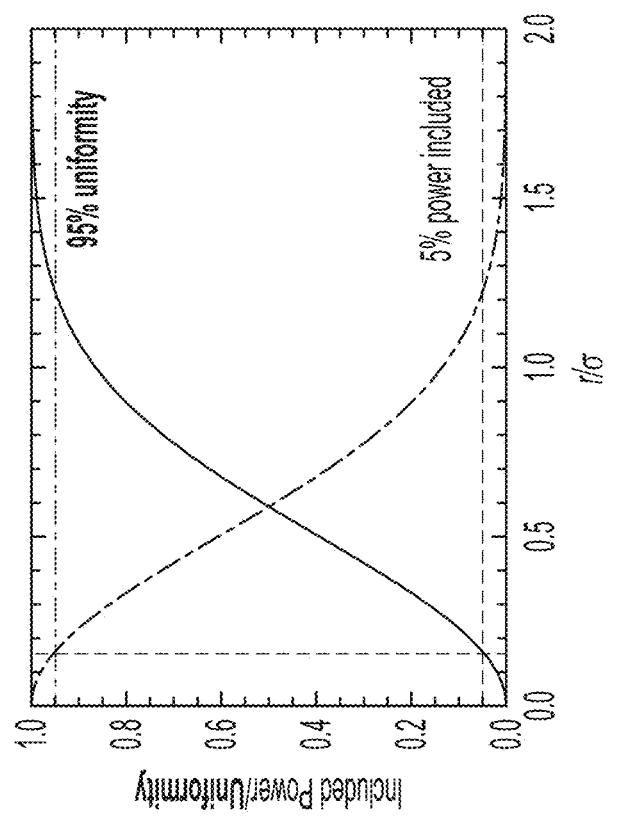
FIG. 2 shows properties of a prior art $TEM_{00}$ Gaussian mode. If a uniformity of 95% is required, only 5% of the laser power is available.
Figure 3:
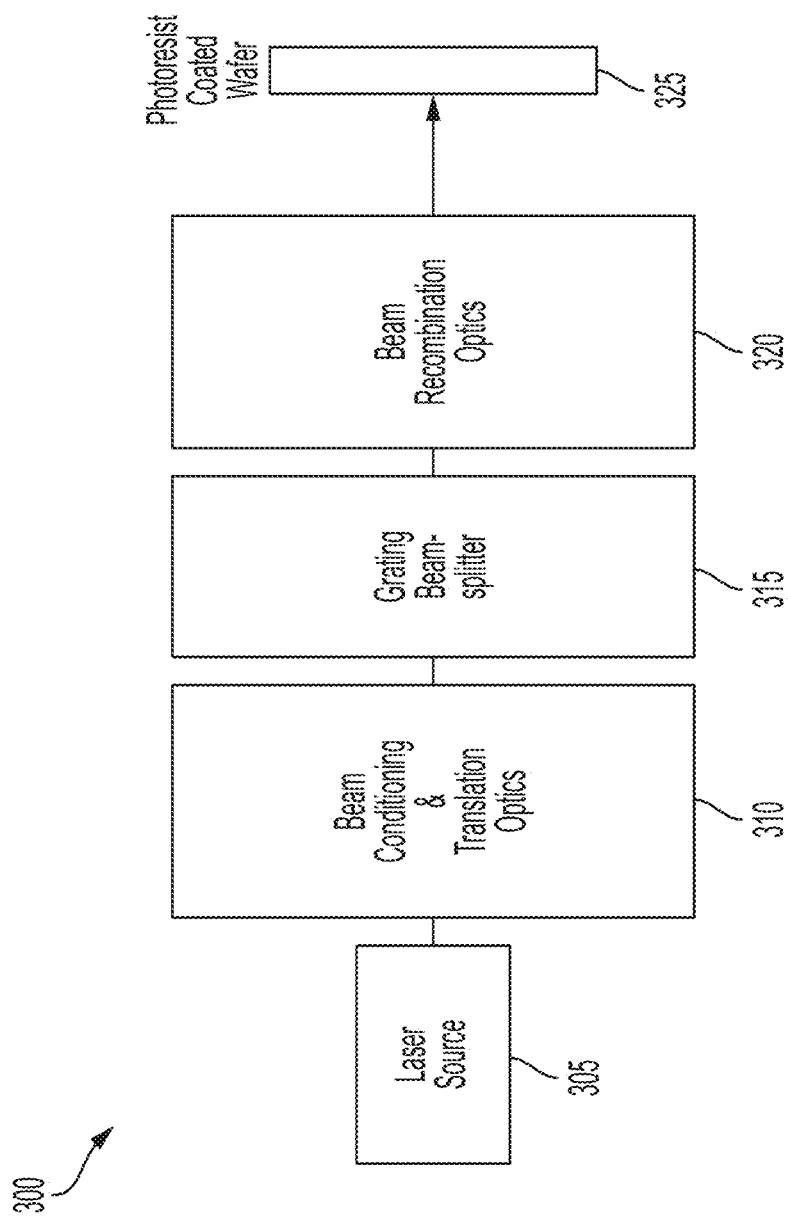
FIG. 3 shows a block diagram of the apparatus for wafer-scale nanopatterning according to examples of the present disclosure.

Generally speaking, examples of the present disclosure describe optical systems that allow fabrication of large area nano-patterned structures. FIG. 3 shows a block diagram of the apparatus for wafer-scale nanopatterning 300 according to examples of the present disclosure. As shown in FIG. 3, the apparatus for wafer-scale nanopatterning 300 comprises laser source 305, beam conditioning and translation optics 310, grating beam splitter 315, and beam recombination optics 320, which are used to image a photoresist coated wafer 325.

For example, the laser source 305 can be a high power ultraviolet source, such as an excimer laser or a Nd:YAG laser with associated nonlinear crystals to generate either third harmonic (355 nm; close to I-line), fourth harmonic (266 nm) or fifth harmonic (216 nm; close to ArF). Characteristics of the laser source 305 of interest are the beam profile, the longitudinal and transverse coherence, and the average power.

For example, the beam conditioning and translation optics 310 are used to prepare the output beam of the laser source 305 for illuminating the large area grating. Optical components of the beam conditioning and translation optics 310 can optionally include components for translation of the beam between laser pulses to average out intensity inhomogeneities and lenses or mirrors for beam expansion. In one example, an approach to the translation is accomplished with a pair of plane parallel transparent plates, one for horizontal and one for vertical deflection, that are rotated to different orientations relative to the laser beam between laser pulses. The thickness of the plates and the rotation angle determine the shift of the laser beam. These are referred to below as beam wobblers. The beam wobblers are placed in the optical path before the beam-splitter so the standing-wave interference pattern at the wafer is independent of the translation. The beam expansion optics can be a single negative lens or mirror that expands the beam, but this leads to a variation (chirp) of the spatial frequency of the pattern exposed on the wafer, or a pair of lenses and mirrors that leads to a collimated beam and a more uniform pattern period. For a high power pulsed laser there should not be a focus in the beam path that could lead to ionization and air breakdown. The choice depends on the requirements of the final pattern. There is an interplay between the expansion of the beam and the extent of the wobble that presents a trade-off between uniformity and exposure time.

For example, the grating beam splitter 315 can be either an amplitude mask or a phase mask and can be either 1D (a simple grating) or 2D (for example a square array of features). Amplitude masks are less expensive and can be more uniform, but a phase mask can lead to more efficient use of the laser power. In one example, a simple 1D amplitude mask is used as described below. Two dimensional patterns can be achieved with multiple exposures of the wafer with rotation between exposures.

Figure 4:
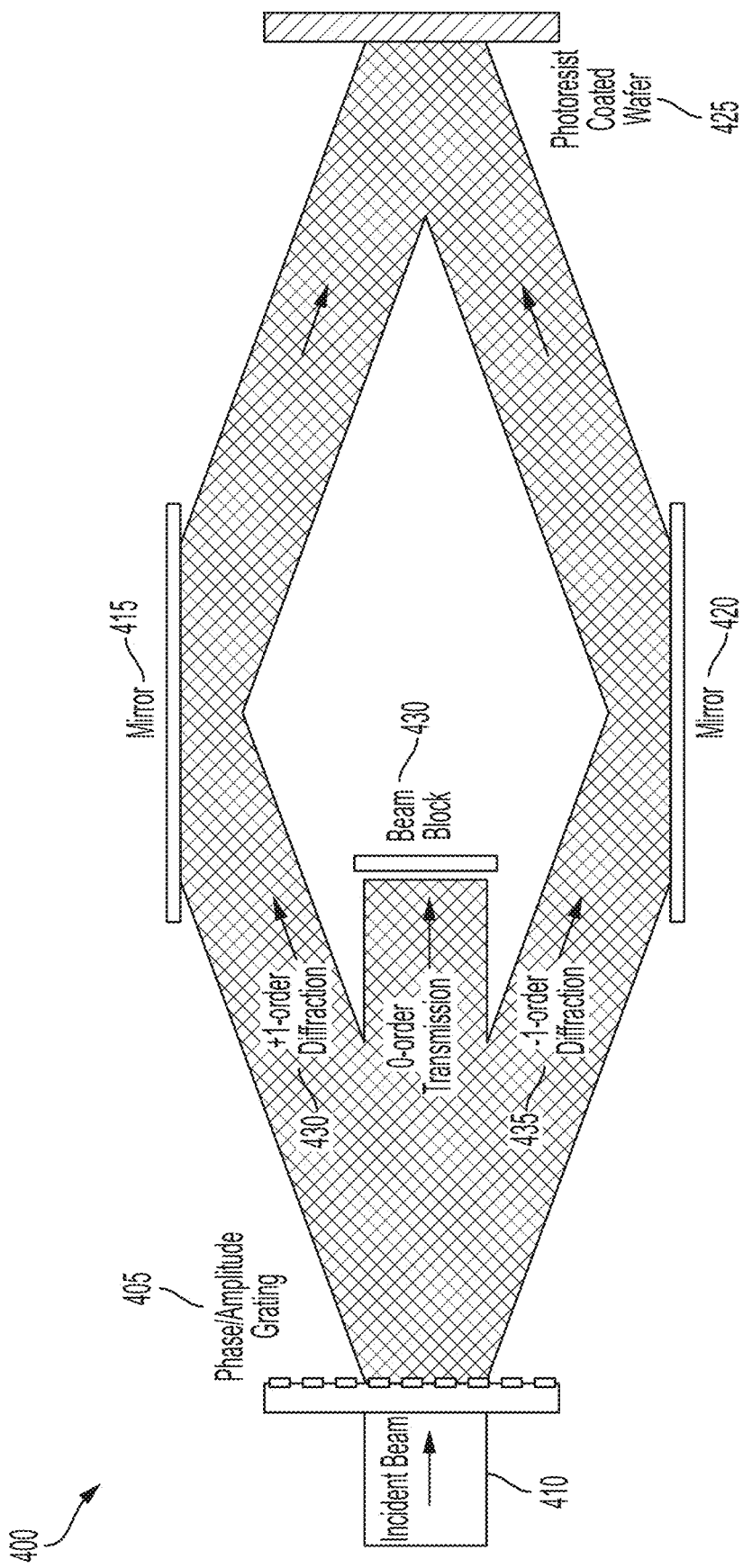
FIG. 4 shows an optical arrangement for optional for beam recombination optics according to examples of the present disclosure.

For example, the beam recombination optics 320 comprises mirrors that collect the appropriate diffracted orders from the grating beam splitter 315 and redirect them to the photoresist coated wafer 325. Additionally, it is useful to block any 0-order transmission so that it does not impinge on the photoresist coated wafer 325 and lead to variations in the exposure pattern. FIG. 4 shows an optical arrangement for optional for beam recombination optics 400 according to examples of the present disclosure. The optical arrangement for optional for beam recombination optics 400 comprises a phase/amplitude grating 405 that receives an incident beam 410, a pair of mirrors 415 and 420 to direct the incident beam 410 to a photo coated wafer 425, such as photoresist coated wafer 325. In the arrangement shown in FIG. 4, the 0-order beam is blocked by beam blocker 430 and does not reach the photoresist coated wafer 425. The two diffracted orders 430 and 435 are redirected to intersect at the photoresist coated wafer 425 producing a standing wave pattern. Assuming that the diffraction angles at the grating are the same as the incident angles at the photoresist coated wafer 425, the resulting pitch at the photoresist coated wafer 425 is twice the pitch (half the period) of the phase/amplitude grating 405.

As long as the diffraction angles and the angles of incidence on the photoresist coated wafer 425 are the same and the beam cross sections are matched, this configuration of FIG. 4 is independent of both the longitudinal and transverse coherence of the source, since individual points on the cross section of the incident beam 410 are transferred to the same position at the photoresist coated wafer 425 and the path lengths of the interfering beams are identical for all points. This allows the use of multimode lasers with poor transverse coherence such as excimer lasers. A possible disadvantage of the arrangement of FIG. 4 is that it requires large mirrors and consumes a large amount of space on an optical table to deal with wafer scale printing. Both of these issues can be cased by locating the photoresist coated wafer above the grating and folding the optical system as shown in FIG. 5A and FIG. 5B.

Figures 5A, 5B:
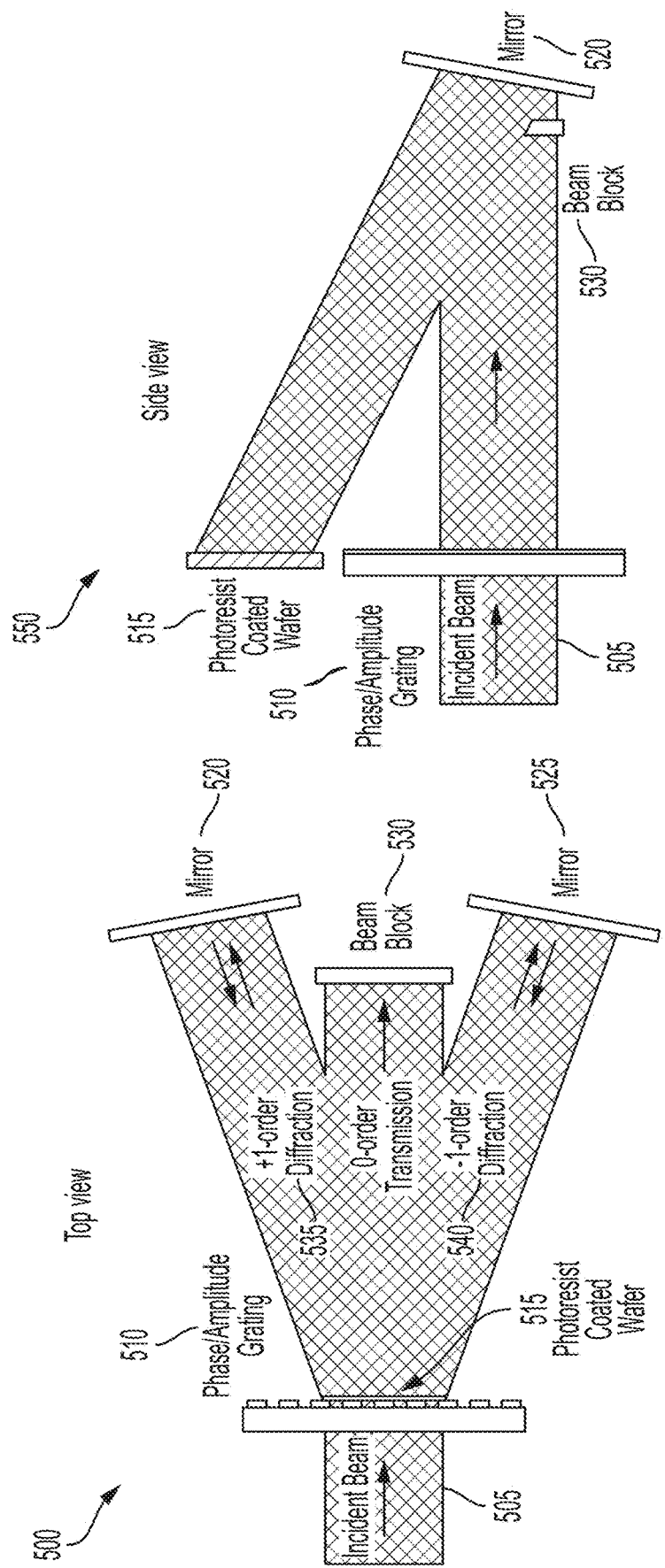
FIG. 5A and FIG. 5B shows a top view and side view, respectively, for an alternative optional optical arrangement for beam recombination optics that leads to a more compact optical system according to examples of the present disclosure.

FIG. 5A and FIG. 5B shows a top view 500 and side view 550, respectively, for an alternative optional optical arrangement for beam recombination optics that leads to a more compact optical system according to examples of the present disclosure. As shown in FIGS. 5A and 5B, the photoresist coated wafer 515 is oriented in a plane parallel to the grating plane of the phase/amplitude grating 510. The incident beam 505 is diffracted by the phase/amplitude grating 510 where the 0-order beam is blocked by beam blocker 530 and does not reach the photoresist coated wafer 515 and the two diffracted orders 535 and 540 are redirected by mirror 520 and mirror 525, respectively, to intersect at the photoresist coated wafer 515 producing a standing wave pattern. Alternatively, the photoresist coated wafer 515 can be tilted towards the normal to the impinging beams.

Figure 6:
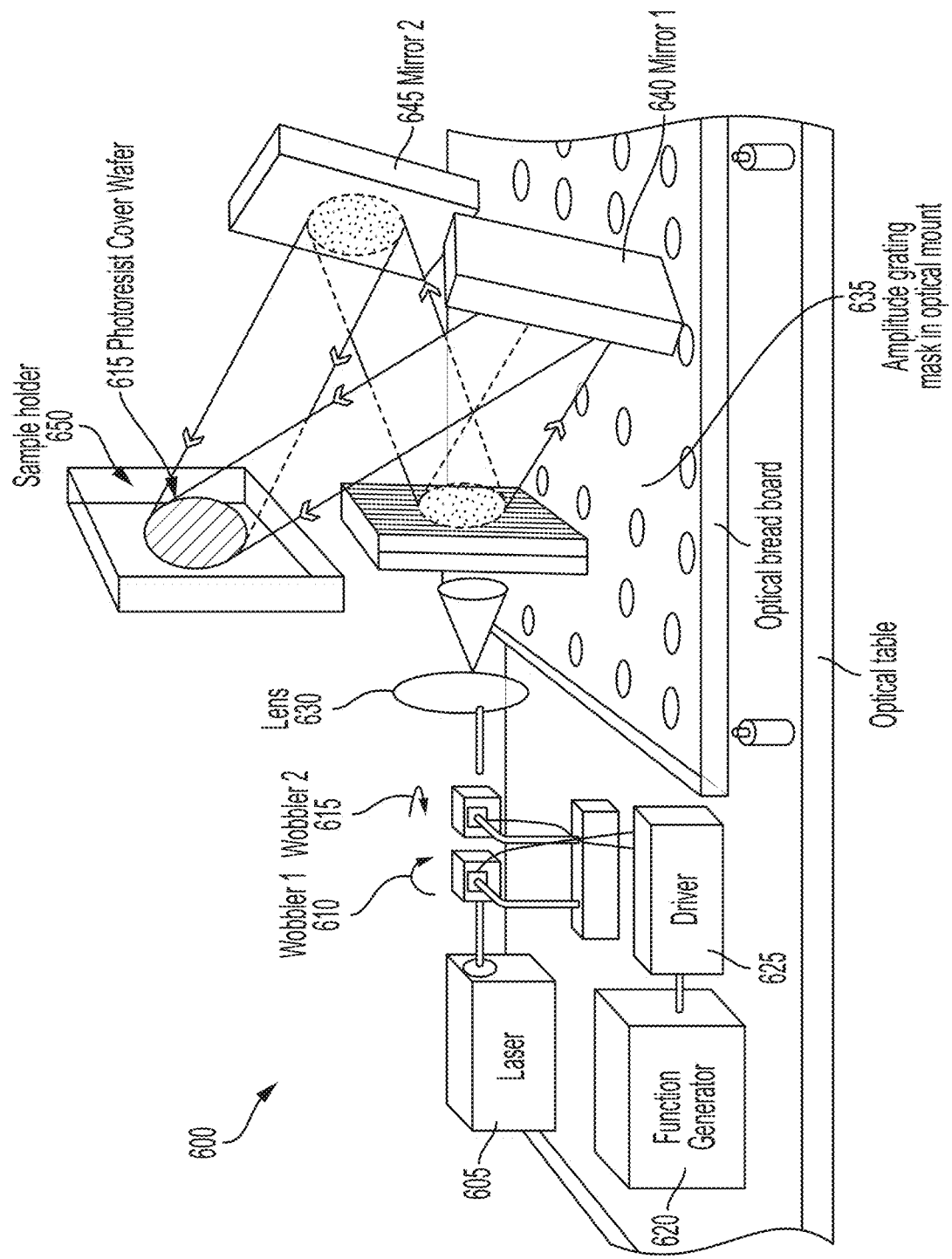
FIG. 6 shows an optical arrangement for large-area, nanoscale interferometric lithography with a low coherence laser source according to examples of the present disclosure.
Figure 7:
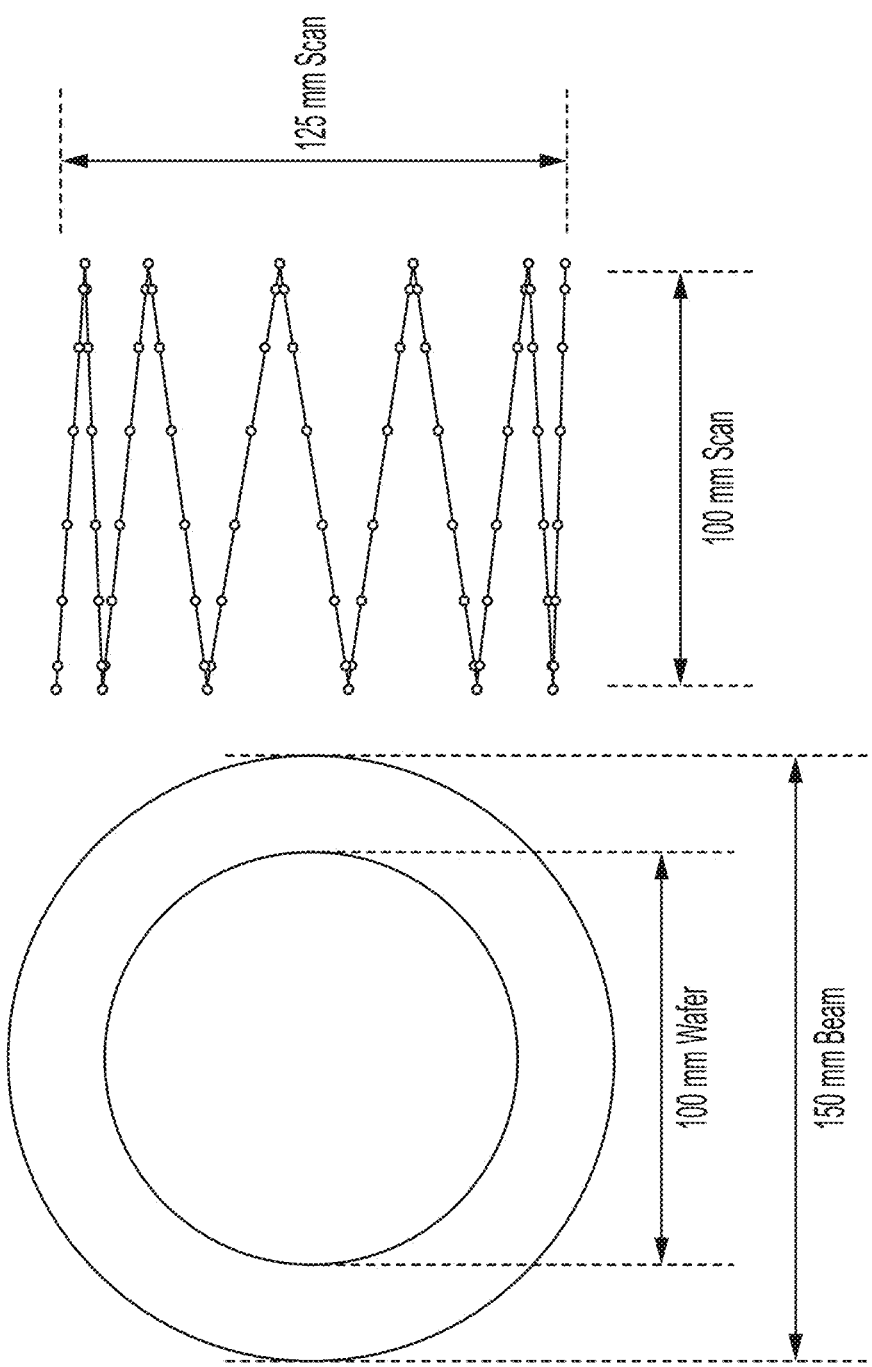
FIG. 7 shows a scanning pattern with beam and wafer sizes according to examples of the present disclosure. The dots on the scan pattern indicate approximate positions of the beam center at each laser pulse.

FIG. 6 shows an optical arrangement for large-area, nanoscale interferometric lithography with a low coherence laser source 600 according to examples of the present disclosure. A laser 605, such as a commercial Nd:YAG laser (1.06 μm wavelength Coherent Infinity™) master-oscillator-power amplifier (MOPA) laser with an internal phase-conjugation double-pass amplifier, is used to provide a nearly single-transverse-mode output operating with 3 ns pulses at up to 100 Hz. Nonlinear crystals, not shown, are used to generate third harmonic radiation at 355 nm at a power of 160 mJ/pulse. This wavelength is matched to the maximum sensitivity of I-line photoresists. This optical system introduced some beam profile non-uniformity associated with imperfections in the optical components; the wobblers 610, 615, one for translation of the beam in the vertical direction and the second for translation in the horizontal direction were used to provide averaging to improve the uniformity of the overall pattern. It is noted that with an interferometric set-up that matches equivalent positions of the beam, such as a grating beam-splitter or the arrangement of FIG. 1B, there is not an intensity mismatch between the two interferometric beams. However, with the Lloyd's mirror arrangement of FIG. 1A, as the beam is scanned by the wobblers 610, 615 across the Lloyd's mirror there will be an intensity mismatch between the two beams at the wafer that will give rise to a DC bias that can affect the final pattern. To some extent, the nonlinear photoresist response can accommodate this DC intensity component. The wobblers 610, 615 are driven by function generator 620 and driver 625, which set the wobble amplitude and frequency. A diverging lens 630, following the wobblers 610, 615, is used to expand the beam to a $1/e^2$ diameter of ~15 cm (6 inches) at the wafer. An amplitude grating mask 635, such as a chrome-on-glass mask of pitch 1400 nm and pattern area of 12.5×12.5 cm², is used as grating beam splitter to generate multiple diffraction orders namely (0-order transmission and ±1$^{st}$ order diffraction) upon illumination with the expanded laser source. Two mirrors 640, 645, such has having dimensions of 11×15 cm², are used to reflect back only the first order diffracted beams to a sample mount 650, such as a vacuum chuck on a tip tilt mount. The mirrors 640, 645 can be held in a ball and socket type adjustable optical mounts. The beam is wobbled at 2 Hz in the vertical direction and at 11 Hz in the horizontal direction. The amplitude of the swing of the beam at the wafer is about 10 cm in the horizontal direction and 12.5 cm in the vertical direction. FIG. 7 shows the scanning pattern that was used experimentally along with the beam size relative to wafer size. The dots on the scan pattern indicate approximate positions of the beam center at each laser pulse. The optimal scan pattern depends on the specifics of the laser beam profile and the wafer size; for each situation there are a number of suitable scan profiles.

For demonstration purposes, a full wafer fabrication area of ~100 mm (4-inch) diameter was chosen; this can be readily scaled to larger wafer sizes. Patterning is done on a photoresist/bottom ARC film spin coated onto a 100 mm diameter silicon wafer. The exposure is based on the principle of interference between two coherent laser beams at wavelength $\lambda$ incident onto a surface at different angles, typically symmetric about the surface normal of +$\theta$ Band −$\theta$ where the period of the pattern is given by $\lambda \cos(\phi)/(2 \sin \theta)$ where $\phi$ is the angle of inclination of the two beams relative to the wafer normal, and $2\theta$ is the angle between the two beams. The laser was operated at 80 Hz and the exposure duration was 55 s.

Figure 8:
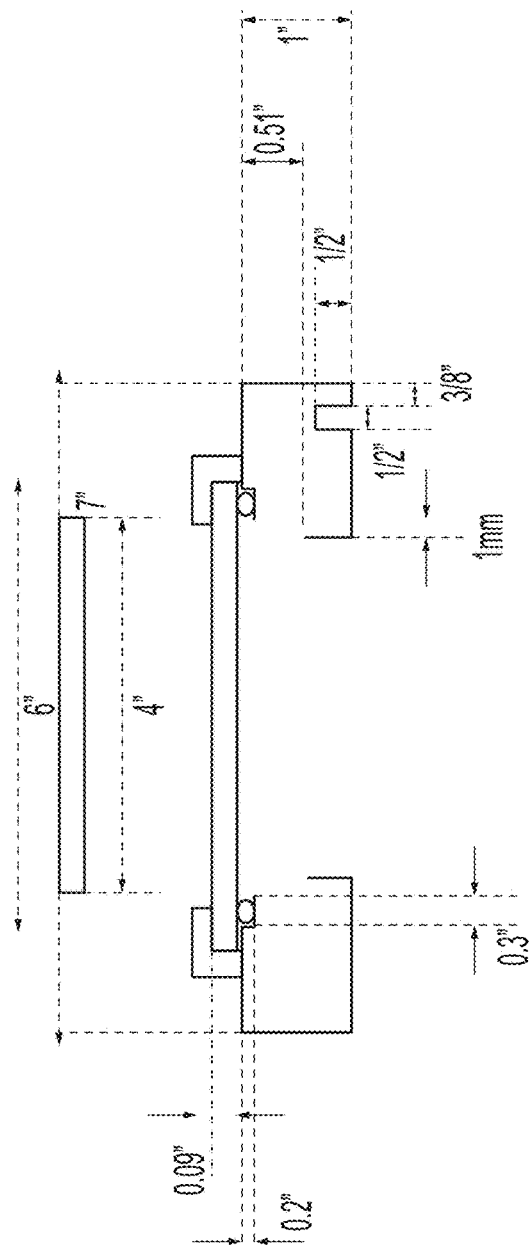
FIG. 8 shows a design of an optical mount according to examples of the present disclosure.
Figure 9:
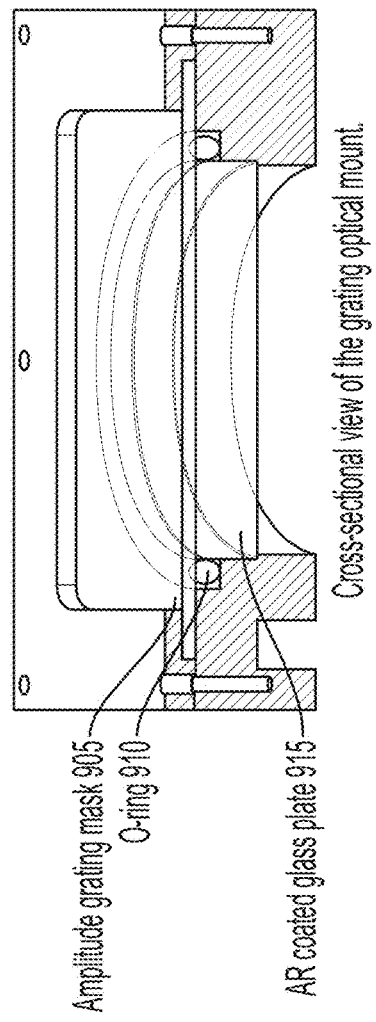
FIG. 9 shows a cross-section view of the grating optical mount of FIG. 8.

It is useful to reduce reflections from the various optical surfaces since these reflections can in turn reflect off of various other optical surfaces including the grating surface and impinge on the wafer. Since the exposure is coherent, these beams interfere with the main exposure beams and give rise to moiré patterns in the photoresist. A surface of particular importance is the front surface of the grating substrate (the side opposite the grating). The light from the laser source is first incident on this surface, light reflected from this surface back towards the laser is usually misaligned and does not have much impact; however the transmitted light then impinges on the grating surface and, in addition to the transmitted orders shown in FIG. 4, FIG. 5A, FIG. 5B, and FIG. 6, there are back-reflected orders. These are in turn partially reflected again towards the grating and the wafer from the front surface of the grating substrate with phases that depend on the thickness of the grating substrate. One solution is to anti-reflection coat the front surface of the grating substrate. If a number of gratings are required, this can become a significant expense. An alternative solution is to fabricate a mount to house an uncoated amplitude mask 905 together with a planar glass piece with a single-sided Anti-Reflection (AR) coating 915 and an index matching liquid, such as glycerin. to reduce the back reflection. O-ring 910 serves to prevent the glycerin from leaking out. FIG. 8 shows a design of an optical mount according to examples of the present disclosure. FIG. 9 shows a cross-section view of the grating optical mount of FIG. 8.

Any reflections from the wafer are misaligned with the wafer in the position shown in FIG. 6. Even is the wafer mount is tilted to $\phi=0$, the large time delay associated with the large scale optical system means that any stray beams reflected back to the wafer are delayed past the duration of the 3 ns laser pulse and are therefore do not interfere with the main exposure. Usually the intensity of these stray beams are negligible unless they interfere with the primary exposure beams.

This configuration produced a 1D full wafer exposure of a 100-mm diameter photoresist coated silicon wafer. The wafer was first spin coated with a back-anti-reflection coating (BARC) material, ICON-16, followed by baking on hot plate at 190° C. for 60 seconds. The spin-coating speed for the BARC was 3000 rpm resulting in a thickness of about 160 nm. Then negative photoresist NR7-500 was spin-coated at 3000 rpm at a thickness of 500 nm. The pre-baking profile used was 150° C. for 60 s. The mean exposure dose was close to 120 mJ/cm$^2$. The exposure time was 55 s. The hot-plate post exposure bake temperature was 100° C. for 60 s.

Figure 10:
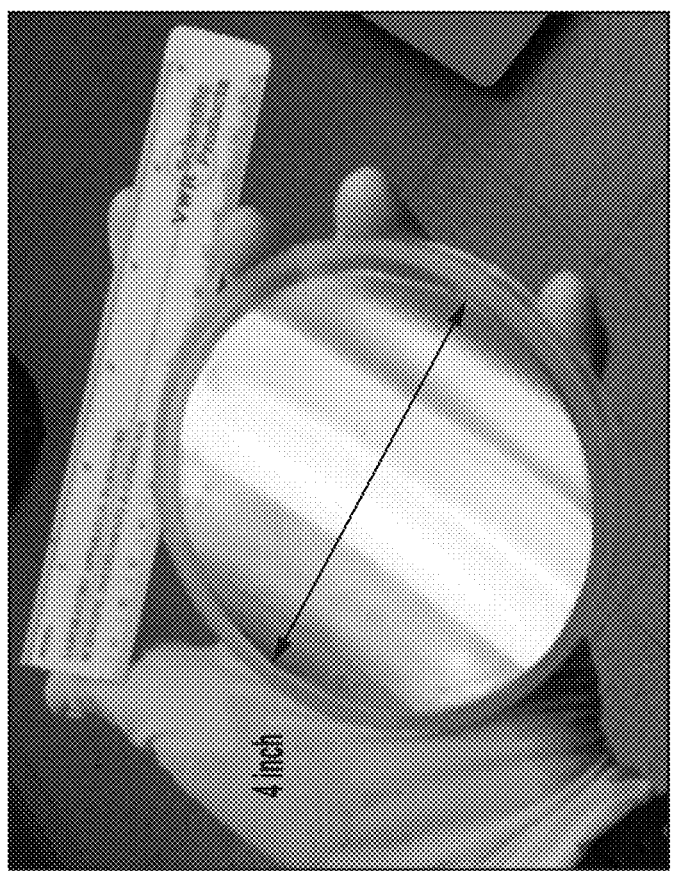
FIG. 10 shows a picture of the full grating for a exposure dose of ~120 $mJ/cm^2$ according to examples of the present disclosure.
Figure 11C:
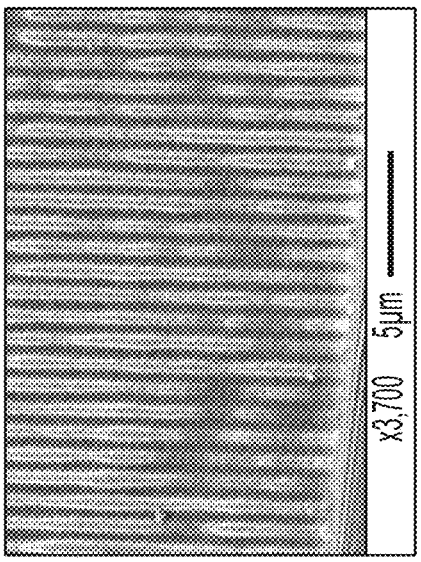
FIG. 11A, FIG. 11B, FIG. 11C, FIG. 11D, FIG. 11E shows SEM images of the sample patterned without wobbling
Figure 11F:
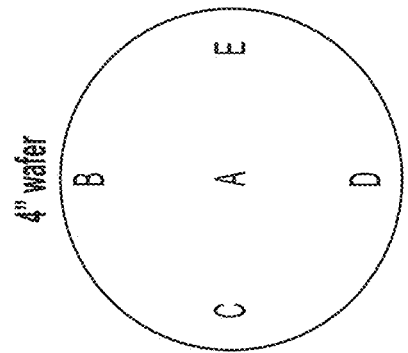
FIG. 11F shows a top view of a wafer according to examples of the present disclosure.
Figure 11B:
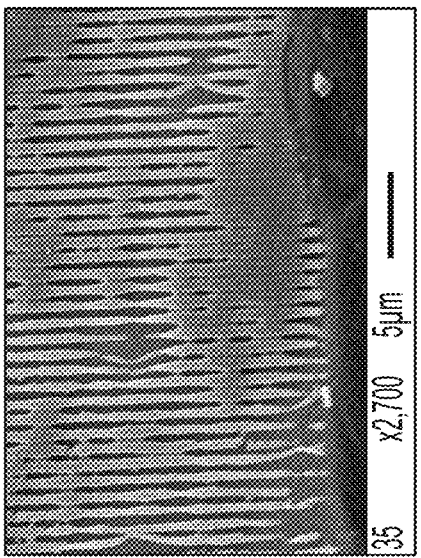
Figure 11E:
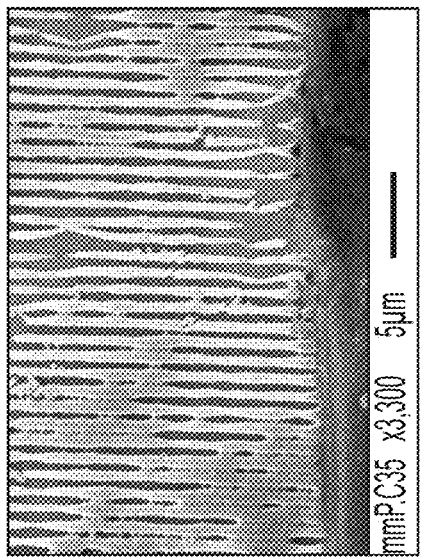
Figure 11A:
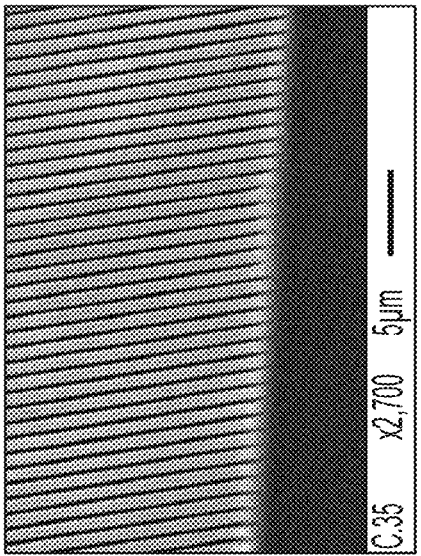
Figure 11D:
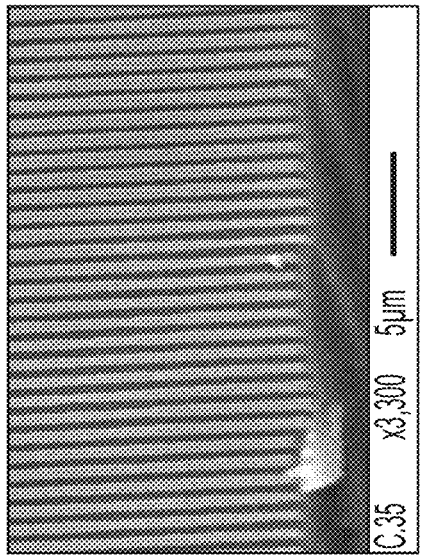
Figure 12A:
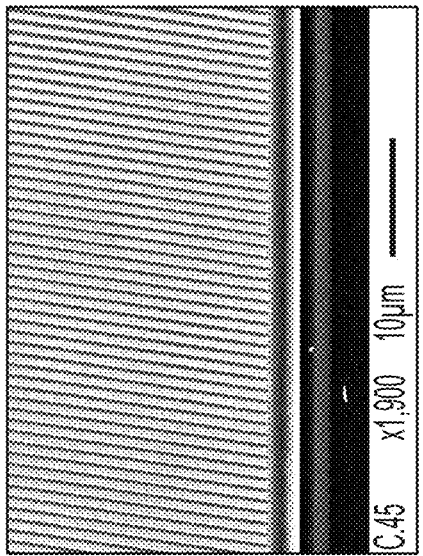
FIG. 12A, FIG. 12B, FIG. 12C, FIG. 12D, FIG. 12E shows SEM images of the sample patterned with wobbling
Figure 12B:
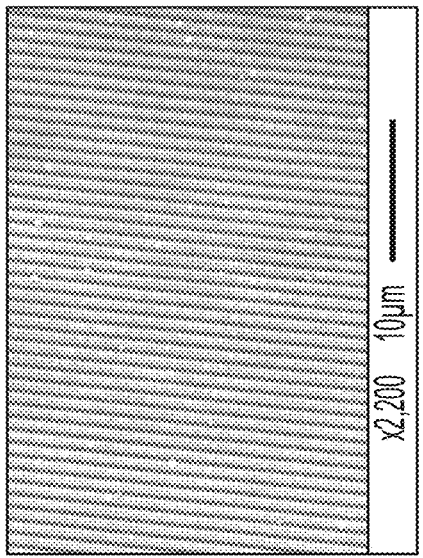
Figure 12C:
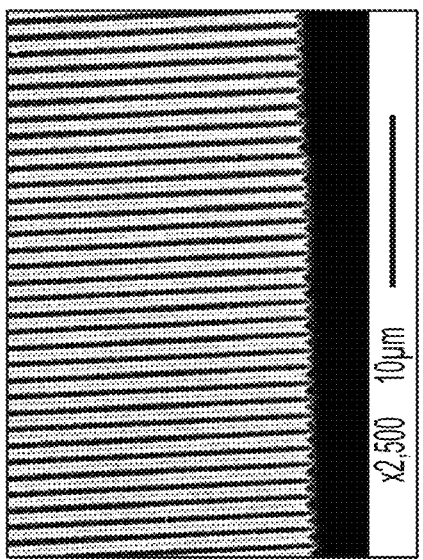
Figure 12D:
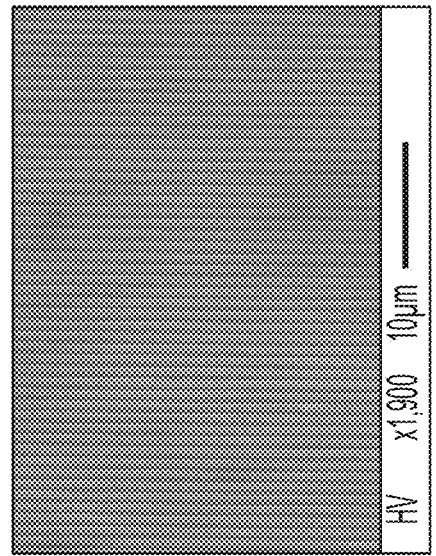
Figure 12E:
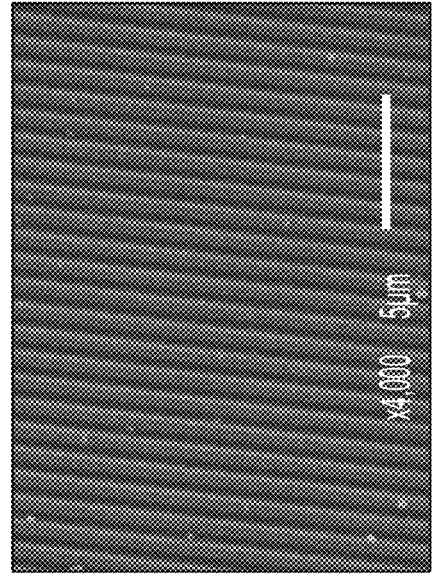
Figure 12F:
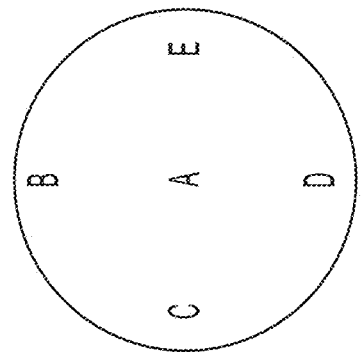
FIG. 12F shows a top view of a wafer according to examples of the present disclosure.

FIG. 10 shows a picture of the full grating for an exposure dose of ~120 mJ/cm$^2$. The exposure time was 55 s. SEMs taken at various locations on the wafer patterned without wobbling are in FIG. 11A, FIG. 11B, FIG. 11C, FIG. 11D, and FIG. 11E and SEMs taken at various locations on the wafer with wobbling are in FIG. 12A, FIG. 12B, FIG. 12C, FIG. 12D, and FIG. 12E. FIG. 11F and FIG. 12F show the approximate wafer positions for these SEMs, respectively. Without the wobble there is substantial non-uniformity of the pattern, particularly at the edges of the wafer. This is much improved with the addition of the wobble to average out the inhomogeneity of the intensity distribution and provide a more uniform exposure.

Two dimensional patterns are available with additional exposures. In particular, rotating the wafer by 90° produces an array of round holes or posts on a square pattern and rotation by 60° produces a hexagonal pattern with elliptical features. Additional beams can be added to the optical configuration to produce additional patterns. Specific patterns require well-defined phase relations between the various beams, this requires positioning of optical surfaces to within a small fraction of a wavelength and adds substantially to the system complexity.

Figure 13:
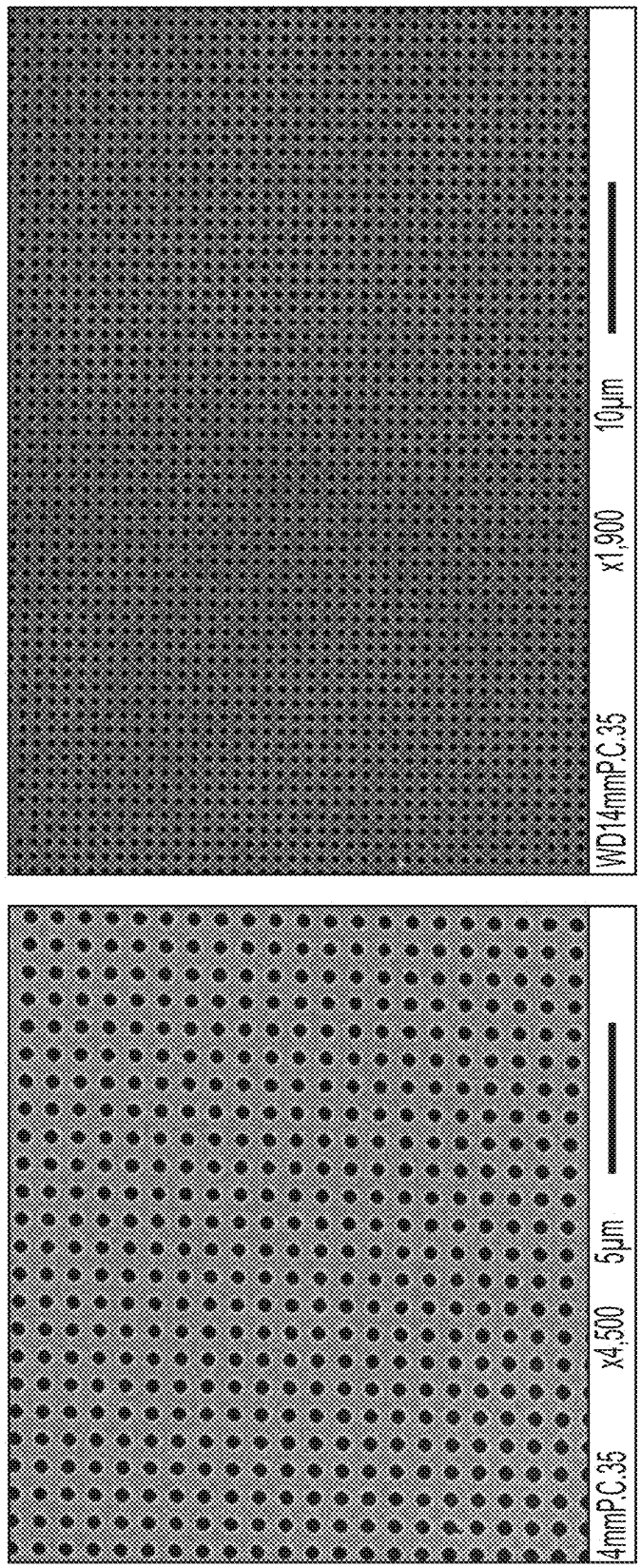
FIG. 13 shows SEM images of 2D hole pattern according to examples of the present disclosure.

FIG. 13 shows a square array 2D pattern obtained at the center of a 4 inch area according to examples of the present disclosure. 2D patterns are obtained by exposing the sample, rotating the sample by 90° and re-exposing it, followed by a single develop step. Efforts are in progress to achieve a 2D pattern over a 100 cm diameter wafer.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following:

either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for large-area, full-wafer nanopatterning comprising:
    directing a laser beam from a laser light source to one or more beam conditioning and translation optics to expand the laser beam to illuminate an area of a full wafer;
    splitting the laser beam from the one or more beam conditioning and translation optics by a grating beam splitter;
    directing at least two beams from the grating beam splitter through recombination optics to provide a standing wave intensity fringe pattern at a photoresist-coated full-wafer target; and
    keeping the wafer stationary while exposing the photoresist-coated full-wafer,
    wherein the beam conditioning optics comprise one or more optical components and one or more actuator components that shift the position of the at least two laser beams on the photoresist-coated full-wafer target without changing the position of the fringes of the standing wave intensity fringe pattern on the wafer during an exposure to improve the uniformity of the exposure.

2. The method of claim 1, wherein a first surface of the grating beam-splitter is anti-reflection coated at the laser wavelength and a phase grating, an amplitude grating, or a phase and amplitude grating is provided on the second surface.

3. The method of claim 1, wherein the first surface of the grating beam-splitter is uncoated and the grating beam-splitter is assembled in optical contact with a plane window with a single anti-reflection coated surface opposite to the grating.

4. The method of claim 1, wherein the recombination optics is configured to position at least two beams from the grating beam splitter onto the photoresist-coated target in a retro-reflector configuration wherein the photoresist-coated target is located adjacent to the grating beam-splitter.

5. An apparatus for large-area, full-wafer nanopatterning comprising:
    a laser light source that produces a laser beam;
    beam conditioning and translation optics that receive the laser beam and expands the laser beam to produce an expanded laser beam that illuminates an area of a full wafer;
    a grating beam splitter that receives the expanded laser beam and produces a plurality of diffracted laser beams;
    recombination optics to direct at least two beams from the plurality of diffracted laser beams produced by the grating beam splitter to provide a standing wave intensity fringe pattern, at a stationary full-wafer photoresist-coated target; and
    a controller for controlling an exposure dose and uniformity at the photoresist-coated target,
    wherein the beam conditioning and translation optics comprise one or more optical components and one or more actuator components that shift the laser beam without displacing changing the position of the fringes of the standing wave intensity fringe pattern on the wafer during an exposure to improve the uniformity of the exposure.

6. The apparatus of claim 5, wherein one surface of the grating beam splitter is anti-reflection coated at the laser wavelength and a phase grating, an amplitude grating, or a phase and amplitude grating is provided on the opposite surface thereof.

7. The apparatus of claim 5, wherein the first surface of the grating beam-splitter is uncoated and the grating beam-splitter is assembled in optical contact with a plane window with a single anti-reflection coated surface.

8. The apparatus of claim 5, wherein the recombination optics is configured to position at least two beams from the grating beam splitter onto the photoresist-coated target in a retro-reflector configuration wherein the photoresist-coated target is located adjacent to the grating beam-splitter.

9. A method for large-area interferometric lithography comprising:
    directing a laser beam through one or more beam translation optics and one or more beam conditioning optics for shifting the laser beam to illuminate multiple areas of a wafer during an exposure without displacing the standing wave intensity fringe pattern and for adjusting the size of the laser beam at the wafer to be exposed;
    splitting the laser beam into at least two sub-beams using a grating beam splitter;
    directing at least two of the sub-beams to form a standing wave interference fringe pattern, characterized by an amplitude profile, at the surface of the wafer to be exposed, wherein the surface of the wafer comprises a photosensitive stack including at least one photoresist layer;
    exposing the wafer that is held stationary during exposure to the at least two of the sub-beams, wherein an exposure position is shifted across the wafer without changing positions of fringes of the standing wave intensity pattern on the wafer using the one or more beam translation optics to improve the uniformity of an exposure; and
    developing at least the at least one photoresist layer.

10. The method of claim 9, wherein the apparatus for shifting the position of the laser beam comprises two transparent windows that are tilted in orthogonal directions on a time scale shorter than the exposure duration.

11. The method of claim 9, wherein the grating beam splitter comprises a grating to generate diffracted orders from the laser beam source.

12. The method of claim 9, wherein the grating beam splitter is a partial reflector.

13. The method of claim 9, wherein the grating beam splitter is a Lloyd's mirror optic that folds part of the laser beam onto itself.

14. An apparatus for large area interferometric lithography comprising:
    a laser source that produces a laser beam;

an optical shifter for shifting the position of the laser beam without moving positions of fringes of a standing wave intensity pattern at a wafer during an exposure;

a beam conditioner for adjusting the size of the beam at a wafer that is held stationary during exposure to be exposed;

a beam-splitter for dividing the laser power into at least two sub-beams;

an optical director for directing two or more of the sub-beams onto the wafer to be exposed;

an exposure controller to adjust a total exposure of a photoresist layer on a surface of the wafer; and a developer to convert the total exposure to a physical relief structure in the photoresist layer on the surface of the wafer.

15. The apparatus of claim 14, wherein the optical shifter that shifts the position of the laser beam comprises two transparent windows that are tilted in orthogonal directions and one or more actuator components that change the orientation of each of these windows on a time scale shorter than a total exposure duration.

16. The apparatus of claim 14, wherein the beam-splitter comprises a grating to generate diffracted orders from the laser beam source.

17. The apparatus of claim 14, wherein the beam-splitter is a partial reflector.

18. The apparatus of claim 14, wherein the beam-splitter is a Lloyd's mirror optic that folds part of the laser beam onto itself.

* * * * *

UNITED STATES PATENT AND TRADEMARK OFFICE
CERTIFICATE OF CORRECTION

| | | |
|---|---|---|
| PATENT NO. | : 12,092,959 B1 | Page 1 of 1 |
| APPLICATION NO. | : 17/592659 | |
| DATED | : September 17, 2024 | |
| INVENTOR(S) | : Steven R. J. Brueck et al. | |

It is certified that error appears in the above-identified patent and that said Letters Patent is hereby corrected as shown below:

In the Claims

Column 12, Line 9: "displacing changing" should be -- changing --.

Signed and Sealed this
Fifth Day of November, 2024

Katherine Kelly Vidal
*Director of the United States Patent and Trademark Office*